(12) United States Patent
Umeda et al.

(10) Patent No.: US 11,420,608 B2
(45) Date of Patent: Aug. 23, 2022

(54) VEHICLE ELECTRICITY STORAGE DEVICE

(71) Applicant: Panasonic Intellectual Property Management Co., Ltd., Osaka (JP)

(72) Inventors: Takeshi Umeda, Osaka (JP); Yohsuke Mitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 532 days.

(21) Appl. No.: 16/491,610

(22) PCT Filed: Aug. 28, 2017

(86) PCT No.: PCT/JP2017/030651
§ 371 (c)(1),
(2) Date: Sep. 6, 2019

(87) PCT Pub. No.: WO2018/179480
PCT Pub. Date: Oct. 4, 2018

(65) Prior Publication Data
US 2020/0010070 A1    Jan. 9, 2020

(30) Foreign Application Priority Data
Mar. 30, 2017   (JP) .............................. JP2017-068873

(51) Int. Cl.
*B60T 17/22*     (2006.01)
*G01R 31/392*    (2019.01)
(Continued)

(52) U.S. Cl.
CPC ............ *B60T 17/22* (2013.01); *B60R 16/033* (2013.01); *G01R 31/016* (2013.01);
(Continued)

(58) Field of Classification Search
CPC ...... B60T 17/22; B60T 8/17; B60T 2270/402; B60R 16/033; G01R 31/016;
(Continued)

(56) References Cited

U.S. PATENT DOCUMENTS 7,380,891 B2 * 6/2008 Ohashi .................... B60T 13/74
                                              303/122.08
8,854,010 B2 * 10/2014 Obata ................... H01M 10/44
                                              320/136
(Continued)

FOREIGN PATENT DOCUMENTS

JP     2005-028908       2/2005
JP     2013066960 A   *  4/2013   ............... B25F 5/00

OTHER PUBLICATIONS

International Search Report of PCT application No. PCT/JP2017/030651 dated Sep. 19, 2017.

*Primary Examiner* — M Baye Diao
(74) *Attorney, Agent, or Firm* — McDermott Will & Emery LLP

(57) ABSTRACT

A vehicle electricity storage device includes a capacitor unit for supplying stored electric power to an electronically controlled system, and a microcomputer including a memory. The memory stores a plurality of thresholds (internal resistance limit values) different from each other. Each of the plurality of thresholds is to be compared with an electrical characteristic value (internal resistance value) related to the capacitor unit for determining a deterioration state of the capacitor unit. The each of the plurality of thresholds is stored in association with an identification ID for identifying the electronically controlled system. The microcomputer acquires the identification ID from the electronically controlled system. And the microcomputer selects, from the plurality of thresholds, a threshold associated with the identification ID acquired. Then the microcomputer deter- (Continued)

mines the deterioration state of the capacitor unit by using the electrical characteristic value and the threshold selected.

5 Claims, 4 Drawing Sheets

(51) Int. Cl.
| | |
|---|---|
| *G01R 31/382* | (2019.01) |
| *B60R 16/033* | (2006.01) |
| *G01R 31/01* | (2020.01) |
| *H02J 9/06* | (2006.01) |
| *B60T 8/17* | (2006.01) |
| *H01M 10/42* | (2006.01) |

(52) U.S. Cl.
CPC ......... *G01R 31/382* (2019.01); *G01R 31/392* (2019.01); *H02J 9/06* (2013.01); *B60T 8/17* (2013.01); *B60Y 2400/11* (2013.01); *H01M 10/4264* (2013.01); *H01M 2010/4271* (2013.01); *H01M 2220/20* (2013.01)

(58) Field of Classification Search
CPC ....... G01R 31/382; G01R 31/392; H02J 9/06; H02J 2207/50; H02J 2310/46; H02J 7/1446; H02J 7/1492; H02J 7/345; B60Y 2400/11; H01M 10/4264; H01M 2010/4271; H01M 2220/20; Y02E 60/10; Y02T 10/70; Y02T 10/92
USPC .......................................................... 701/70
See application file for complete search history.

(56) References Cited

U.S. PATENT DOCUMENTS

| | | | |
|---|---|---|---|
| 9,263,909 B2 * | 2/2016 | Obata | ..................... H02J 7/007 |
| 9,395,417 B2 * | 7/2016 | Song | ..................... H02J 7/0013 |
| 2005/0269870 A1 | 12/2005 | Ohashi et al. | |
| 2009/0326749 A1 * | 12/2009 | Uchida | ................. B60L 53/305 320/109 |
| 2019/0077267 A1 * | 3/2019 | Song | ........................ B60L 58/21 |

* cited by examiner

VEHICLE ELECTRICITY STORAGE DEVICE

CROSS-REFERENCE TO RELATED APPLICATIONS

This application is a U.S. national stage application of the PCT International Application No. PCT/JP2017/030651 filed on Aug. 28, 2017, which claims the benefit of foreign priority of Japanese patent application 2017-068873 filed on Mar. 30, 2017, the contents all of which are incorporated herein by reference.

TECHNICAL FIELD

The present invention rerates to a vehicle electricity storage device that can be an auxiliary power supply configured to back up a main power supply.

BACKGROUND

In recent years, an increasing number of automobiles have employed an electronically controlled brake system that brakes a vehicle by electric control. To the electronically controlled brake system, electric power for driving brakes is supplied from a battery. In this case, if electric power is not supplied from the battery for some reason, electric control cannot be performed. To address this issue, an auxiliary power supply is mounted on an automobile for supplying electric power to the electronically controlled brake system in place of the battery in an emergency.

To order to surely supply electric power in an emergency by using such an auxiliary power supply, it is important to be able to grasp a state of deterioration of the auxiliary power supply caused by a change over time or other causes. Therefore, for example, a power supply backup unit disclosed in Unexamined Japanese Patent Publication No. 2005-28908 is proposed as the auxiliary power supply. The power supply backup unit uses a capacitor unit constituted by a plurality of capacitors, and the deterioration state of this capacitor unit can be determined by the power supply backup unit.

In the power supply backup unit in Unexamined Japanese Patent Publication No. 2005-28908, an internal resistance value and an internal capacitance value of a capacitor unit are measured during charging of the capacitor unit. The measured internal resistance value is compared with a limit value (hereinafter, referred to as an "internal resistance limit value"), of the internal resistance value, which corresponds to the measured internal capacitance value, so that the deterioration state of the capacitor unit is determined.

SUMMARY

When the capacitor unit is deteriorated due to a change over time or other causes, the internal capacitance value decreases, and the internal resistance value increases. When the internal capacitance value decreases, an amount of charge that can be charged decreases. When the internal resistance value increases, an amount of a voltage drop of the capacitor unit increases in a situation that an identical current flows from the power supply backup unit. Therefore, in the power supply backup unit, the internal resistance limit value (a characteristic curve of the internal resistance limit value) is set so that even when the charge amount of the capacitor unit decreases, the charge amount will not become smaller than a charge amount required by the electronically controlled brake system and that even when the voltage drop amount of the capacitor unit increases, the dropped voltage will not become lower than a voltage required by the electronically controlled brake system.

However, the charge amount and the voltage required by the electronically controlled brake system would be inherently different, if there is a difference in a configuration of the electronically controlled brake system or the like, depending on automobile models or automobile manufacturers. Therefore, to secure reliability and safety of the power supply backup unit by securing the required charge amount and voltage, it is necessary to manufacture a dedicated power supply backup unit in which the internal resistance limit value compatible with the electronically controlled brake system is set for each automobile model or automobile manufacturer. However, in this case, productivity of the power supply backup unit is thought to be declined.

In view of the above issues, the present invention provides a highly productive vehicle electricity storage device in which reliability and safety are secured.

A main aspect of the present invention relates to a vehicle electricity storage device to be connected to an electronically controlled system mounted on a vehicle. The electronically controlled system is further connected to a main power supply of the vehicle. A vehicle electricity storage device according to the present aspect includes an electricity storage unit for supplying stored electric power to the electronically controlled system, and a controller including a memory unit that stores a plurality of thresholds different from each other, and a controller. Each of the plurality of thresholds is to be compared with an electrical characteristic value related to the electricity storage unit for determining a deterioration state of the electricity storage unit. The each of the plurality of thresholds is stored in association with identification information for identifying the electronically controlled system. In the vehicle electricity storage device, the controller acquires the identification information from the electronically controlled system. And the controller selects, from the plurality of thresholds, a threshold associated with the identification information acquired. Then the controller determines the deterioration state of the electricity storage unit by using the electrical characteristic value and the threshold selected.

The present invention can provide a highly productive vehicle electricity storage device in which reliability and safety are secured.

Effects and meanings of the present invention will be further clarified in the following description of an exemplary embodiment. However, the exemplary embodiment shown below is merely one example of implementation of the present invention, and the present invention is not at all limited to the example described in the following exemplary embodiment.

DESCRIPTION OF EMBODIMENT

Hereinafter, an exemplary embodiment of the present invention is described with reference to the drawings.

In present exemplary embodiment, battery 2 corresponds to a "main power supply" described in the claims. Capacitor unit 110 corresponds to an "electricity storage unit" described in the claims Microcomputer 150 corresponds to a "controller" described in the claims Memory 150a corresponds to a "memory unit" described in the claims.

However, the above description is only intended to define correspondence between the configuration of the claims and the configuration of the exemplary embodiment. The above correspondence does not limit the invention of the claims to the configuration of the exemplary embodiment.

Figure 1:
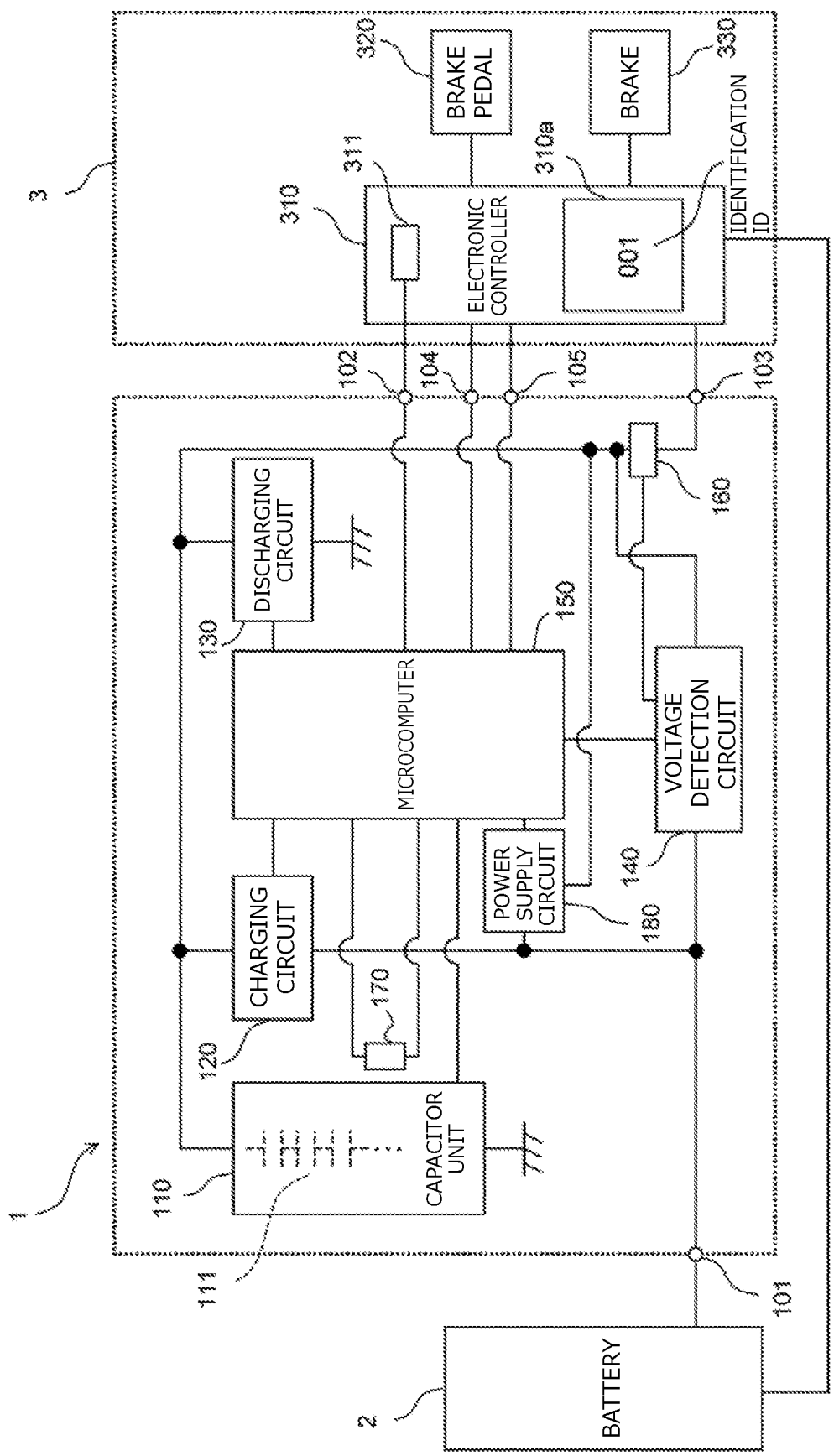
FIG. 1 is a circuit block diagram illustrating a configuration of a vehicle electricity storage device, a battery, and an electronically controlled brake system according to an exemplary embodiment.

FIG. 1 is a circuit block diagram illustrating a configuration of vehicle electricity storage device 1, battery 2, and electronically controlled brake system 3 according to the present exemplary embodiment.

Vehicle electricity storage device 1 is mounted on an automobile such as a gasoline vehicle, a hybrid vehicle, and an electric vehicle. Vehicle electricity storage device 1 is connected between battery 2, which is a main power supply, and electronically controlled brake system 3, and functions as an auxiliary power supply that supplies electric power to electronically controlled brake system 3 when battery 2 loses the ability to supply electric power.

An output voltage of battery 2 can be, for example, 12 V. Battery 2 is connected to electric power input terminal 101 of vehicle electricity storage device 1. Battery 2 supplies electric power to vehicle electricity storage device 1 through electric power input terminal 101. Further, battery 2 is connected to electronic controller 310 of electronically controlled brake system 3 and supplies electric power to electronic controller 310.

Electronically controlled brake system 3 includes electronic controller 310, brake pedal 320, and brake 330. Electronic controller 310 includes a control circuit such as a central processing unit (CPU), a drive circuit for driving brake 330, and the like. When brake pedal 320 is stepped on, a brake signal is output from brake pedal 320 to electronic controller 310. Based on the brake signal, electronic controller 310 controls brake 330, and brake 330 brakes tires of the automobile. Note that brake 330 can be provided, for example, for all the four tires of the automobile.

Electronic controller 310 includes memory 310a. In memory 310a, an identification identifiers (IDs) are stored. The identification IDs are identification information for identifying electronically controlled brake system 3, and are used to determine a deterioration state of capacitor unit 110 to be described later. Electronic controller 310 further includes wake-up switch 311. Wake-up switch 311 turns on and off in conjunction with operation of a not-shown ignition key (a key used to start an engine). When wake-up switch 311 is turned on, a start-up signal for starting up vehicle electricity storage device 1 is output to microcomputer 150 of vehicle electricity storage device 1 through start-up signal input terminal 102.

Vehicle electricity storage device 1 includes capacitor unit 110, charging circuit 120, discharging circuit 130, voltage detection circuit 140, and microcomputer 150.

Capacitor unit 110 includes a plurality of capacitors 111 that are series-connected. It is preferable that capacitors 111 be capable of rapid charge and discharge, and electric double-layer capacitors are used as capacitors 111, for example. Note that the plurality of capacitors are parallel-connected in some cases.

Capacitor unit 110 is connected to output terminal 103 via switching element 160 constituted by a field-effect transistor (FET) or the like. Output terminal 103 is connected to electronic controller 310.

Charging circuit 120 is connected to electric power input terminal 101 and charges capacitor unit 110 with the electric power supplied from battery 2. Charging circuit 120 includes a constant current control circuit (not shown) to make a voltage increase of capacitor unit 110 close to a constant value. Discharging circuit 130 performs discharge from capacitor unit 110.

Voltage detection circuit 140 detects a voltage that is output from battery 2. Voltage detection circuit 140 further detects a voltage at which capacitor unit 110 is being charged, during charging of capacitor unit 110. The detected voltage is output to microcomputer 150. Further, voltage detection circuit 140 turns switching element 160 ON and OFF depending on the detected output voltage of battery 2. If the output voltage of battery 2 is a normal value, switching element 160 is put in an OFF-state, and if the output voltage of battery 2 becomes an abnormal value, switching element 160 is put in an ON-state.

Microcomputer 150 controls operation of charging circuit 120 and discharging circuit 130. Microcomputer 150 further performs a deterioration state determination process for self-determining the deterioration state of capacitor unit 110. The deterioration state determination process for capacitor unit 110 will be described later in detail.

Microcomputer 150 transmits and receives various signals to and from electronic controller 310 via signal input terminal 104 and signal output terminal 105. Further, to microcomputer 150 there is connected temperature sensor 170. Temperature sensor 170 detects a temperature of capacitor unit 110 and outputs a temperature signal based on the detected temperature to microcomputer 150. Further, microcomputer 150 is supplied with electric power from power supply circuit 180.

Next, operation of vehicle electricity storage device 1 and electronically controlled brake system 3 will be described.

When the ignition key is turned on to start up the engine of the automobile, wake-up switch 311 turns on, and the start-up signal from wake-up switch 311 to microcomputer 150 makes vehicle electricity storage device 1 start up. Vehicle electricity storage device 1 and electronic controller 310 are supplied with the output voltage of battery 2 (for example, 12 V). A charge permission signal to permit charging to be performed is output from electronic controller 310, and the charge permission signal is input to microcomputer 150 via signal input terminal 104. Microcomputer 150 causes charging circuit 120 to charge capacitor unit 110 with electric charge. When capacitor unit 110 is charged up to full charge voltage Vc (for example, 12 V) and the charging is completed, microcomputer 150 stops the operation of charging circuit 120. Note that a configuration may be employed in which microcomputer 150 does not output a control signal to stop the operation of charging circuit 120, but charging circuit 120 automatically reduces a charging current when capacitor unit 110 exhibits full charge voltage Vc.

On the other hand, electronic controller 310 is detecting the output voltage of battery 2 with an internal voltage detection circuit (not shown). If the output voltage of battery 2 is equal to or higher than a standard level (for example, 9.5 V), it means battery 2 is normal. And thus electronic controller 310 makes battery 2 continue the supply of electric power to electronic controller 310.

Receiving the supply of electric power from battery 2, electronically controlled brake system 3 normally operates, and brake 330 starts up on the basis of brake pedal 320 being operated, so that the tires are appropriately braked.

After that, when the engine of the automobile is stopped and the ignition key is turned off, wake-up switch 311 is turned off. The supply of electric power from battery 2 to vehicle electricity storage device 1 and electronic controller 310 is stopped. At this time, microcomputer 150 causes discharging circuit 130 to operate to discharge electric charge from capacitor unit 110.

Next, a description will be given on how vehicle electricity storage device 1 and electronically controlled brake system 3 operate when electric power cannot be supplied from battery 2 due to a failure or other causes.

If the output voltage of battery 2 drops and becomes lower than the standard level due to an abnormality occurred in battery 2, electronic controller 310 determines that the output voltage of battery 2 is abnormal. A power supply switching circuit (not shown) embedded in electronic controller 310 performs switching operation to shut off the supply of electric power from battery 2 to electronic controller 310. On the other hand, voltage detection circuit 140 turns on switching element 160 when the detected output voltage becomes lower than the standard level. This operation causes the electric charge stored in capacitor unit 110, which is the electric power stored in capacitor unit 110, to be supplied to electronic controller 310 via output terminal 103.

When electronic controller 310 determines that battery 2 becomes abnormal, electronic controller 310 outputs an abnormality signal. In an interior of the automobile, it is displayed on a monitor that battery 2 is abnormal or the abnormality of battery 2 is notified by voice so that the driver is prompted to stop the automobile immediately. In response to the display or the notification, the driver performs a braking operation. At this time, receiving the electric power supplied from vehicle electricity storage device 1 in place of battery 2, electronically controlled brake system 3 normally operates, and brake 330 starts up on the basis of brake pedal 320 being operated, so that the tires are appropriately braked. This stops the automobile safely.

Vehicle electricity storage device 1 of the present exemplary embodiment includes a function to self-determine the deterioration state (abnormal state) of capacitor unit 110. This function of self-determination of the deterioration state will be described below in detail.

Figure 2:
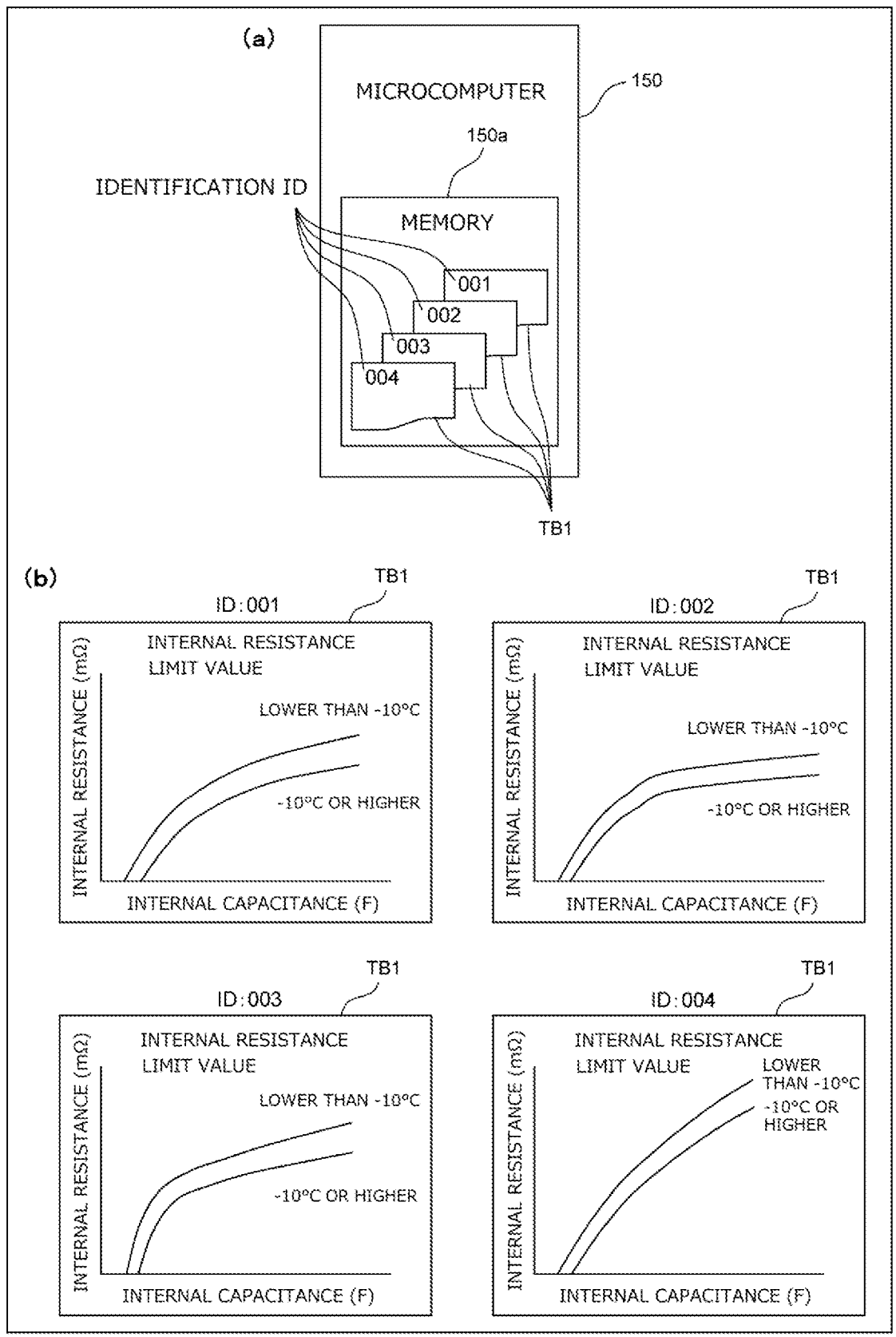
FIG. 2 is a diagram showing (a) how a plurality of deterioration determination tables are stored in a memory of a microcomputer of the vehicle electricity storage device and (b) individual deterioration determination tables according to the exemplary embodiment.

FIG. 2(a) is a diagram showing how a plurality of deterioration determination tables TB1 are stored in memory 150a of microcomputer 150 of vehicle electricity storage device 1 according to the present exemplary embodiment. FIG. 2(b) is a diagram for illustrating individual deterioration determination tables TB1 according to the present exemplary embodiment.

As shown in FIG. 2(a), in vehicle electricity storage device 1, the plurality of deterioration determination tables TB1 are stored in memory 150a of microcomputer 150 in association with the identification IDs for identifying electronically controlled brake system 3 with which each deterioration determination table TB1 is compatible.

In the present exemplary embodiment, the internal resistance value and the internal capacitance value, which are the electrical characteristic values of capacitor unit 110, are obtained by microcomputer 150. And the obtained internal resistance value is compared with the limit value of the internal resistance value (hereinafter, referred to as the "internal resistance limit value") with respect to the obtained internal capacitance value, so that the deterioration state of capacitor unit 110 is determined.

Therefore, each deterioration determination table TB1 stores two types of internal resistance limit values represented by the characteristic curves of FIG. 2(b) (for example, the internal resistance limit value at temperatures lower than −10° C., and the internal resistance limit value at temperatures equal to or higher than −10° C.), depending on the temperature of capacitor unit 110.

When capacitor unit 110 is deteriorated due to a change over time or other causes, the internal capacitance value decreases, and the internal resistance value increases. When the internal capacitance value decreases, an amount of charge that can be charged decreases. When the internal resistance value increases, an amount of voltage drop of capacitor unit 110 unit when an identical current flows from vehicle electricity storage device 1 increases. Therefore, in vehicle electricity storage device 1, the internal resistance limit value (a characteristic curve of the internal resistance limit value) is set so that even when the charge amount of capacitor unit 110 decreases, the charge amount will not become smaller than a charge amount required by electronically controlled brake system 3 and that even when the voltage drop amount of capacitor unit 110 increases, the dropped voltage will not become lower than a voltage required by electronically controlled brake system 3.

When a configuration and the like of electronically controlled brake system 3 is different depending on automobile models or automobile manufacturers, electronically controlled brake system 3 requires a different charge amount and voltage. Therefore, in the present exemplary embodiment, the internal resistance limit value is set compatible with each of electronically controlled brake systems 3 of individual automobile models or automobile manufacturers. And deterioration determination tables TB1 of the internal resistance limit values are stored in memory 150a of microcomputer 150 in association with identification IDs owed by corresponding electronically controlled brake systems 3.

In vehicle electricity storage device 1 of the present exemplary embodiment, a deterioration state determination process is performed by microcomputer 150 to achieve a function of self-determination of the deterioration state.

Figure 3:
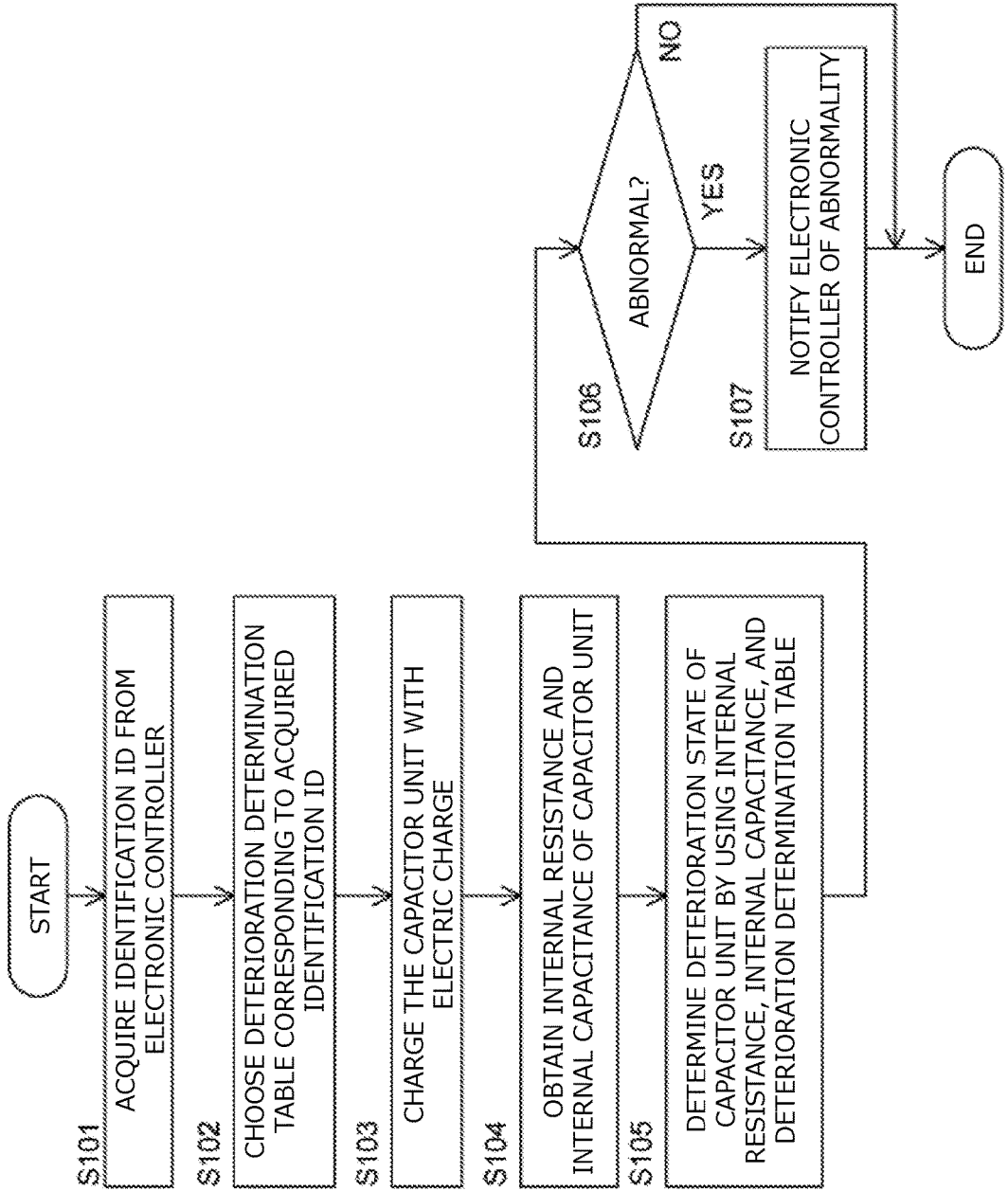
FIG. 3 is a flowchart showing a deterioration state determination process according to the exemplary embodiment.
Figure 4:
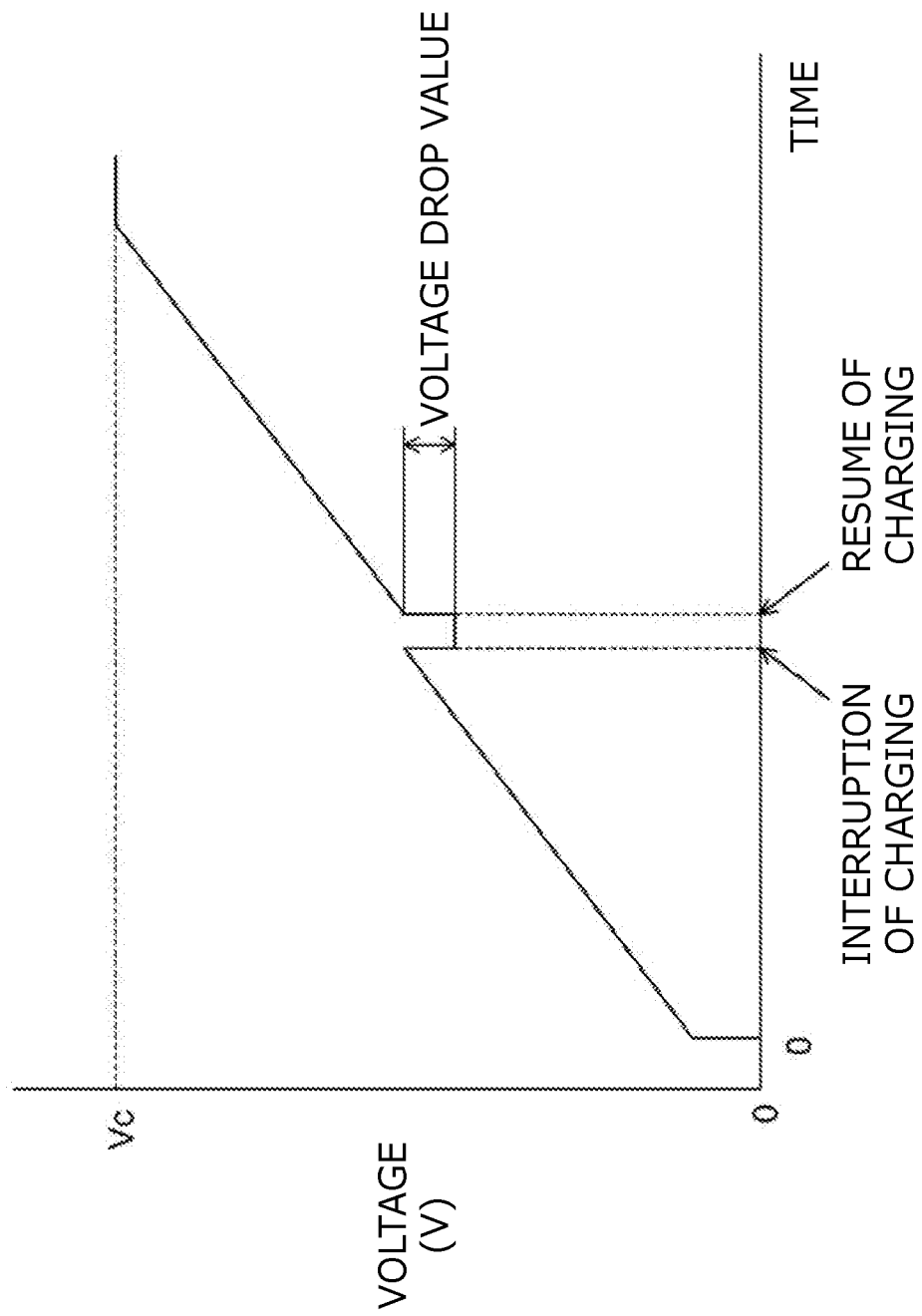
FIG. 4 is a diagram showing a voltage of a capacitor unit during charging, according to the exemplary embodiment.

FIG. 3 is a flowchart showing a deterioration state determination process according to the present exemplary embodiment. FIG. 4 is a diagram showing a voltage of capacitor unit 110 during charging, according to the present exemplary embodiment.

When wake-up switch 311 is turned on and electric power is supplied from battery 2 to vehicle electricity storage device 1, the deterioration state determination process is started.

First, microcomputer 150 acquires, from electronic controller 310, the identification ID held by electronic controller 310 (step S101). At this time, a signal that substantially functions as a request signal, such as a request signal for requiring the identification ID to be transmitted or a signal indicating that vehicle electricity storage device 1 is completely started up, may be transmitted from microcomputer 150 to electronic controller 310. On the basis of this signal, the identification ID may be transmitted from electronic controller 310. Alternatively, such a request signal or the like is not transmitted, but the identification ID may be transmitted from electronic controller 310 in response to start of supply of electric power from battery 2 to electronic controller 310.

Next, microcomputer 150 selects deterioration determination table TB1 corresponding to the identification ID from the plurality of deterioration determination tables TB1 stored in memory 150a (step S102). By this operation, the internal resistance limit value that is compatible with electronically controlled brake system 3 to which vehicle electricity storage device 1 is connected is selected.

Next, microcomputer 150 makes capacitor unit 110 be charged with electric charge (step S103). Further, during the charging, microcomputer 150 obtains the internal resistance value and the internal capacitance value of capacitor unit 110 (step S104).

Specifically, from the start of charging, microcomputer 150 detects, with a voltage detection circuit 140, the voltage at which capacitor unit 110 is being charged. As shown in FIG. 4, microcomputer 150 interrupts charging for a predetermined time (for example, 80 ms) in the process of charging. When the charging is interrupted, the voltage detected by voltage detection circuit 140 drops by a voltage corresponding to the internal resistance value of capacitor unit 110. Microcomputer 150 obtains the voltage drop value at this time, and obtains the internal resistance value from the voltage drop value and an electric current value (the constant current value by the constant current control circuit) flowing during charging.

Further, microcomputer 150 obtains a voltage change ratio per unit time during the charging, and obtains an internal capacitance value from the voltage change ratio and the electric current value flowing during the charging. At this time, although the charging is performed with a constant current, the voltage change ratio is not always constant due to non-linearity of capacitor 111. Therefore, it is preferable that microcomputer 150 cyclically obtains the voltage change ratio for a plurality of times and obtains the internal capacitance value from an average value of the obtained voltage change ratios.

When the internal resistance value and the internal capacitance value are thus obtained, microcomputer 150 determines the deterioration state of capacitor unit 110 by using the obtained internal resistance value and internal capacitance value and deterioration determination table TB1 selected by the process of step S102 (step S105). Specifically, microcomputer 150 measures the temperature of capacitor unit 110 with temperature sensor 170 and selects, from deterioration determination table TB1, the internal resistance limit value corresponding to the measured temperature from the two types of internal resistance limit values. Then, microcomputer 150 obtains the internal resistance limit value with respect to the obtained internal capacitance value by using the selected internal resistance limit value, and determines the deterioration state of capacitor unit 110 by comparing the internal resistance limit value with the obtained internal resistance value.

If the internal resistance value is not greater than the internal resistance limit value, the capacitor unit 110 is normal. And thus it is possible to secure the charge amount and the voltage that are required by electronically controlled brake system 3. On the other hand, if the internal resistance value is greater than the internal resistance limit value, capacitor unit 110 is abnormal. And thus it is impossible to secure the charge amount and the voltage that are required by electronically controlled brake system 3.

If capacitor unit 110 is normal (step S106: NO), microcomputer 150 finishes the deterioration state determination process without executing any step. On the other hand, if capacitor unit 110 is abnormal (step S106: YES), microcomputer 150 notifies the abnormality to electronic controller 310 by outputting an abnormality signal (step S107). In the interior of the automobile, on the basis of the notification, it is displayed on the monitor that vehicle electricity storage device 1 is abnormal, or the abnormality of vehicle electricity storage device 1 is notified by voice. This enables the driver to grasp that there is an abnormality occurring with vehicle electricity storage device 1. After notifying electronic controller 310 of the abnormality, microcomputer 150 finishes the deterioration state determination process.

Note that the configuration may be made such that when deterioration determination table TB1 is once selected on the basis of the identification ID, the following information is recorded: the identification ID at that time; and which deterioration determination table TB1 is that selected deterioration determination table TB1, and steps S101 and S102 are not performed from the next time. In this case, microcomputer 150 includes a memory such as a non-volatile memory that can hold information such as identification ID even when electric power is not supplied to microcomputer 150.

However, when the configuration is made as described above, the deterioration state determination process becomes complex, and the deterioration state determination process can be incorrectly performed when an error occurs in the recorded information such as the identification ID. Therefore, it is preferable that, as in the present exemplary embodiment, the identification ID be acquired and deterioration determination table TB1 be selected every time when the deterioration state determination process is performed.

Advantageous Effects of Exemplary Embodiment

The present exemplary embodiment provides the following advantageous effects.

On the basis of the identification ID acquired from electronically controlled brake system 3, deterioration determination table TB1 compatible with that electronically controlled brake system 3 is selected from the plurality of deterioration determination tables TB1 (the internal resistance limit values). Hence, it is possible to properly determine the deterioration state of capacitor unit 110 with respect to a plurality of different electronically controlled brake systems 3. Therefore, it is not necessary to manufacture dedicated vehicle electricity storage device 1 for each different electronically controlled brake system 3, and the productivity of vehicle electricity storage device 1 is therefore improved.

Further, every time the deterioration state determination process is performed, the identification ID is acquired to select deterioration determination table TB1. Hence, the deterioration state determination process is simple unlike the configuration in which information such as the identification ID is recorded. In addition, there is no need for concern that an error can occur in the information such as the identification ID and the deterioration state determination process cannot be correctly performed.

Although the exemplary embodiment of the present invention has been described above, the present invention is not limited to the exemplary embodiment described above, and application examples of the present invention can be modified in various manners in addition to the above exemplary embodiment.

For example, in the above exemplary embodiment, microcomputer 150 of vehicle electricity storage device 1 and electronic controller 310 of electronically controlled brake system 3 can communicate with each other by a communication method by which communication can be made between a master and a plurality of slaves. In this communication method, an ID is attached, as header information, to communication data from the master, where the ID is used to identify the slave functioning as a receiver of the communication data.

When communication is performed by this communication method, electronic controller 310 functions as the master, and microcomputer 150 functions as the slave. In the above configuration of the above exemplary embodiment, since the slave is only microcomputer 150, there is no need for identification of the slave by an ID. Therefore, the above ID can be used as the identification ID. Specifically, on a side of electronic controller 310, a different ID is attached to the communication data (for example, attached to the charge permission signal) from electronic controller 310 of each different electronically controlled brake system 3; and on a side of microcomputer 150, deterioration determination tables TB1 are stored in memory 150a in association with individual IDs. Microcomputer 150 reads out the ID attached to the communication data from electronic controller 310, for example, the ID attached to the first communication data after electronic controller 310 is supplied with electric power, so that microcomputer 150 can select deterioration determination table TB1 associated with the ID.

When this method is used, a program on the side of electronically controlled brake system 3 does not have to be largely modified to transmit the identification ID.

In the above exemplary embodiment, the obtained internal resistance value is compared with the internal resistance limit value, which is the threshold of the internal resistance value, to determine the deterioration state of capacitor unit 110. However, a configuration may be employed in which the obtained internal capacitance value is compared with a predetermined threshold to determine the deterioration state of capacitor unit 110.

Further, in the above exemplary embodiment, vehicle electricity storage device 1 includes, as the electricity storage unit, capacitor unit 110 constituted by a plurality of capacitors 111. However, vehicle electricity storage device 1 may include an electricity storage unit constituted by an electricity storage element other than capacitors 111. Also in this case, in a similar manner to the above exemplary embodiment, the electrical characteristic value related to the electricity storage element is obtained and is compared with a predetermined threshold, so that the deterioration state of the electricity storage unit is determined.

Further, in the above exemplary embodiment, deterioration determination table TB1 is selected before the internal resistance value and the internal capacitance value are obtained; however, deterioration determination table TB1 may be selected after the internal resistance value and the internal capacitance value are obtained. Specifically, in the deterioration state determination process of FIG. 3, the process of steps S101 and S102 and the process of steps S103 and S104 may be switched in order, for example.

Further, in the above exemplary embodiment, the internal resistance value and the internal capacitance value are measured when capacitor unit 110 is being charged. However, the internal resistance value and the internal capacitance value may be measured when capacitor unit 110 is being discharged. In this case, the internal resistance value and the internal capacitance value is obtained during the discharge to be performed when the engine stops, and the deterioration state is then determined, for example. In this case, the deterioration state determination process is started upon a shut down of the engine. In a case where an abnormality is found as a result of the determination, because the determination result cannot be immediately notified to electronic controller 310, the result indicating the abnormality is stored in a non-volatile memory or the like and is notified to electronic controller 310 when vehicle electricity storage device 1 is started up next time. Alternatively, the configuration may be made as follows. The full charge voltage Vc of capacitor unit 110 is set higher than usual, and a small amount of charge is discharged when the charging is completed. In this case, the internal resistance value and the internal capacitance value may be obtained during the above discharge. In this case, in a similar manner to the above exemplary embodiment, the deterioration state determination process is started upon starting up of the engine. Note that in this case, the voltage drop due to the discharge is set to such an extent that does not affect the supply of electric power to electronically controlled brake system 3.

Further, in the above exemplary embodiment, deterioration determination table TB1 has two types of internal resistance limit values corresponding to temperatures; however, deterioration determination table TB1 may have an internal resistance limit value for each of three or more temperature zones, depending on temperature characteristics of capacitor 111. Alternatively, instead of preparing a plurality of internal resistance limit values corresponding to different temperatures, deterioration determination table TB1 may have one internal resistance limit value.

In addition, the exemplary embodiment of the present invention can be modified in various ways as appropriate within the scope of the technical idea disclosed in the appended claims. In the above exemplary embodiment, the vehicle electricity storage device used in the electronically controlled brake system has been described. However, the scope of application of the present invention is not limited to this, and the present invention may be applied to a battery system for an electronically controlled system that performs controlling a device other than the brake.

The present invention is useful in a vehicle electricity storage device used in a vehicle such as an automobile.

The invention claimed is:

1. A vehicle electricity storage device to be connected to an electronically controlled system mounted on a vehicle, the electronically controlled system being further connected to a main power supply of the vehicle, the vehicle electricity storage device comprising:
    an electricity storage unit for supplying stored electric power to the electronically controlled system; and
    a controller including a memory unit that stores a plurality of thresholds different from each other, each of the plurality of thresholds being to be compared with an electrical characteristic value related to the electricity storage unit for determining a deterioration state of the electricity storage unit, the each of the plurality of thresholds being stored in association with identification information for identifying the electronically controlled system,
    wherein:
    the controller acquires the identification information from the electronically controlled system,
    the controller selects, from the plurality of thresholds, a threshold associated with the identification information acquired, and
    the controller determines the deterioration state of the electricity storage unit by using the electrical characteristic value and the threshold selected.

2. The vehicle electricity storage device according to claim 1, wherein the electrical characteristic value is an internal resistance value or an internal capacitance value of a capacitor unit included in the electricity storage unit.

3. The vehicle electricity storage device according to claim 1, wherein:
   the electricity storage unit includes a capacitor unit including a plurality of capacitors,
   the electrical characteristic value includes an internal resistance value of the capacitor unit,
   the each of the plurality of thresholds includes a limit value of the internal resistance value, the limit value of the internal resistance value corresponding to an internal capacitance value of the capacitor unit,
   the controller obtains the internal resistance value and the internal capacitance value, and
   the controller determines the deterioration state of the capacitor unit by comparing the internal resistance value with the limit value of the internal resistance value corresponding to the internal capacitance value.

4. The vehicle electricity storage device according to claim 1, wherein every time when the controller determines the deterioration state of the electricity storage unit, the controller acquires the identification information from the electronically controlled system and selects the threshold from the plurality of thresholds.

5. The vehicle electricity storage device according to claim 1, wherein the electronically controlled system is an electronically controlled brake system.

* * * * *